(12) United States Patent
Lee et al.

(10) Patent No.: US 10,993,043 B2
(45) Date of Patent: Apr. 27, 2021

(54) MEMS ACOUSTIC SENSOR

(71) Applicant: SHIN SUNG C&T CO., LTD., Seoul (KR)

(72) Inventors: Sang woo Lee, Ann Arbor, MI (US); Ci Moo Song, Yongin-si (KR); Keun Jung Youn, Incheon (KR); Yong Kook Kim, Seoul (KR); Kyu dong Jung, Suwon-si (KR); Muhammad Ali Shah, Seoul (KR)

(73) Assignee: SHIN SUNG C&T CO., LTD., Seoul (KR)

( * ) Notice: Subject to any disclaimer, the term of this patent is extended or adjusted under 35 U.S.C. 154(b) by 0 days.

(21) Appl. No.: 16/564,798

(22) Filed: Sep. 9, 2019

(65) Prior Publication Data

US 2021/0076141 A1    Mar. 11, 2021

(51) Int. Cl.
| | | |
|---|---|---|
| H04R 19/04 | (2006.01) |
| H04R 19/00 | (2006.01) |
| H04R 1/04 | (2006.01) |
| H04R 7/16 | (2006.01) |
| B81B 3/00 | (2006.01) |

(52) U.S. Cl.
CPC ........... *H04R 19/04* (2013.01); *B81B 3/0037* (2013.01); *H04R 1/04* (2013.01); *H04R 7/16* (2013.01); *H04R 19/005* (2013.01); *B81B 2201/0257* (2013.01); *B81B 2203/0127* (2013.01); *B81B 2203/0307* (2013.01); *B81B 2203/04* (2013.01); *H04R 2201/003* (2013.01)

(58) Field of Classification Search
CPC ...... H04R 19/00; H04R 19/005; H04R 19/04; H04R 2201/003
See application file for complete search history.

(56) References Cited

U.S. PATENT DOCUMENTS

| | | | | |
|---|---|---|---|---|
| 8,921,957 B1* | 12/2014 | Zhang | ...................... | H04R 1/04 257/416 |
| 8,976,985 B2* | 3/2015 | Kasai | ...................... | H04R 19/04 381/174 |
| 9,369,804 B2* | 6/2016 | Buck | ...................... | H04R 31/00 |
| 9,540,226 B2* | 1/2017 | Klein | ................... | H04R 31/006 |
| 9,544,697 B2* | 1/2017 | Uchida | ................... | H04R 19/04 |

(Continued)

FOREIGN PATENT DOCUMENTS

| | | |
|---|---|---|
| CN | 102812729 A | 12/2012 |
| KR | 20070104522 A | 10/2017 |

(Continued)

OTHER PUBLICATIONS

Official Notification of Examination and Search Report issued by the Intellectual Property Office—Ministry of Economic Affairs for corresponding Taiwan Patent Application No. 108132266, dated Nov. 24, 2020, with an English translation.

*Primary Examiner* — Ryan Robinson
(74) *Attorney, Agent, or Firm* — Myers Wolin, LLC

(57) ABSTRACT

Provided is a MEMS acoustic sensor including a substrate and a cavity, a back plate supported on the substrate and including a plurality of through-holes, at least one anchor projecting from the back plate toward the substrate, and a diaphragm supported by the at least one anchor and deformed by a sound wave introducing from the outside through the cavity, wherein no part of the deformed diaphragm comes into contact with the substrate.

16 Claims, 19 Drawing Sheets

(56) References Cited

U.S. PATENT DOCUMENTS

| | | | | |
|---|---|---|---|---|
| 10,057,684 B2* | 8/2018 | Perletti | ............... | B81B 3/0054 |
| 10,312,427 B2* | 6/2019 | Umeda | ............... | H04R 19/016 |
| 10,715,924 B2* | 7/2020 | Cheng | ................. | H04R 19/04 |
| 10,721,576 B2* | 7/2020 | Zhang | ................. | B81B 3/0051 |
| 2008/0019543 A1* | 1/2008 | Suzuki | ................. | H04R 31/00 |
| | | | | 381/174 |
| 2013/0264663 A1* | 10/2013 | Dehe | ..................... | B81B 3/007 |
| | | | | 257/416 |
| 2015/0041930 A1* | 2/2015 | Kim | ..................... | H04R 31/00 |
| | | | | 257/416 |
| 2019/0062146 A1* | 2/2019 | Hanley | ............... | B81B 7/0016 |

FOREIGN PATENT DOCUMENTS

| | | |
|---|---|---|
| TW | 200746868 A | 12/2007 |
| TW | I327033 B | 7/2010 |
| TW | I530158 B | 4/2016 |
| TW | 201736246 A | 10/2017 |
| TW | 201737725 A | 10/2017 |

* cited by examiner

MEMS ACOUSTIC SENSOR

BACKGROUND

1. Technical Field

The present invention relates to an acoustic sensor implemented in a microelectromechanical system (MEMS), and more particularly, to a MEMS acoustic sensor for sensing a variable capacitance between a flexible diaphragm and a back plate.

2. Description of the Related Art

Generally, an acoustic sensor such as a condenser microphone converts a capacitance change, which is caused by a deformation of a diaphragm due to external sound pressure, to an electrical signal. It is attached to a microphone, a telephone, a mobile phone, a video tape recorder, and the like. Particularly, in recent years, such an acoustic sensor may be realized by micro-electromechanical system (MEMS) technology, thereby providing mass production and miniaturization.

The MEMS acoustic sensor has a diaphragm that moves in response to sound pressure and a fixed opposing element that is acoustically transparent. The diaphragm functions as a moving electrode of a condenser microphone, and the opposing element functions as a fixed electrode of the microphone condenser. Further, the MEMS acoustic sensor has a means for detecting and measuring a change in capacitance of the microphone condenser. The diaphragm is embodied as a thin membrane above a semiconductor substrate of the element and is suspended over an acoustic cavity provided at the back surface of the semiconductor substrate. The opposing element is located above or below the diaphragm so as to face the diaphragm.

Manufacturing such MEMS acoustic sensors using semiconductor manufacturing processes has significant advantages in terms of production cost, repeatability, and size reduction. The process may be used in a variety of applications such as communication, audio, ultrasound range, imaging and motion detection systems, with or without some modification.

In general, in order to achieve a wide bandwidth and a high sensitivity in a miniaturized MEMS acoustic sensor, it is required to form a diaphragm structure having a small size and a high sensitivity. Although it is possible to improve the flexibility of the diaphragm by changing the material, thickness, and wrinkle structure of the diaphragm, sufficient input sound pressure must be given to vibrate the diaphragm of these MEMS acoustic sensors. Further, there is a limit in that the MEMS acoustic sensor provides high SNR and high sensitivity at the same time.

In addition, conventional MEMS acoustic sensors may be degraded in a low-frequency range when they are miniaturized to 1 mm or less by using a semiconductor MEMS process. Particularly, the general frequency response characteristic of the MEMS acoustic sensor exhibits high sensitivity in a low-frequency band when the area of the diaphragm is wide, and low sensitivity when the area is narrow although it may cover a high-frequency band. Considering the requirements for the characteristics of such a MEMS acoustic sensor, studies are underway to improve the overall package structure or the shape of the diaphragm itself.

FIG. 1 is a schematic diagram showing the operation of a conventional MEMS acoustic sensor 5. The MEMS acoustic sensor 5 may be variously used such as a MEMS microphone, a receiver, a speaker, a MEMS pressure sensor, a MEMS pump, or the like. The MEMS acoustic sensor 5 detects a change in coupling capacitance between a back plate 2 having perforated through-holes and a vibrating membrane or a diaphragm 3, in which the change is caused by sound pressure. This change in capacitance is caused by a change in an air gap between the diaphragm 3 and the back plate 2, which is varied by the sound pressure. Both are spaced apart to have such a variable air gap, and the outer side of the diaphragm 3 are supported by suitable support structures 6a and 6b. These support structures 6a and 6b are formed on a substrate 1, and the substrate 1 is provided with a cavity 4 for introducing a sound wave. Various ways such as point support, clamp support, or spring support may be used as the support structure.

As such, in the conventional MEMS acoustic sensor, the support structure such as an anchor is formed on the substrate, and the cavity for introducing the sound wave is also formed through the substrate. Therefore, a movable area of the diaphragm is also limited depending on the size of the cavity, and the support structure such as the anchor must be located in an area other than the cavity. Such a structure not only restricts the degree of freedom in design but also has a limited sensor size or a limited cavity size.

SUMMARY

Aspects of the present invention are to improve a structure of a MEMS acoustic sensor and optimize anchor positions to increase the change of the coupling capacitance between a diaphragm and a back plate and to increase the mechanical stability of a diaphragm against residual stress and over temperature change.

Aspects of the present invention provide an improved diaphragm structure for exhibiting a high sensitivity in a MEMS acoustic sensor.

Aspects of the present invention provide sensing stability of a MEMS acoustic sensor by eliminating the thermal stress or heat distortion effect generated in a diaphragm produced by MEMS processes.

However, aspects of the present invention are not restricted to those set forth herein. The above and other aspects of the present invention will become more apparent to one of ordinary skill in the art to which the present invention pertains by referencing the detailed description of the present invention given below.

According to an aspect of the present invention, there is provided a MEMS acoustic sensor comprising a substrate comprising a cavity, a back plate supported on the substrate and comprising a plurality of through-holes, at least one anchor projecting from the back plate toward the substrate, and a diaphragm supported by the at least one anchor and deformed by a sound pressure introduced from the outside through the cavity, wherein no part of the deformed diaphragm comes into contact with the substrate directly or through an anchor.

In a MEMS acoustic sensor according to aspects of the present invention, it is possible to have a diaphragm with sufficient effective movable area larger than a cavity formed in a substrate, and thus relatively high sensor sensitivity may be achieved in the MEMS acoustic sensor of a limited size.

In a MEMS acoustic sensor according to aspects of the present invention, support structures for supporting the diaphragm may be formed at the desired positions regardless of a size or position of the cavity. Therefore, not only the degree of freedom of design is improved, but also the vibration modes of interest of may be achieved easily.

In a MEMS acoustic sensor according to aspects of the present invention, it is possible to minimize the sensing error of the MEMS acoustic sensor by eliminating the thermal stress or heat distortion generated in a diaphragm before and after MEMS processes.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
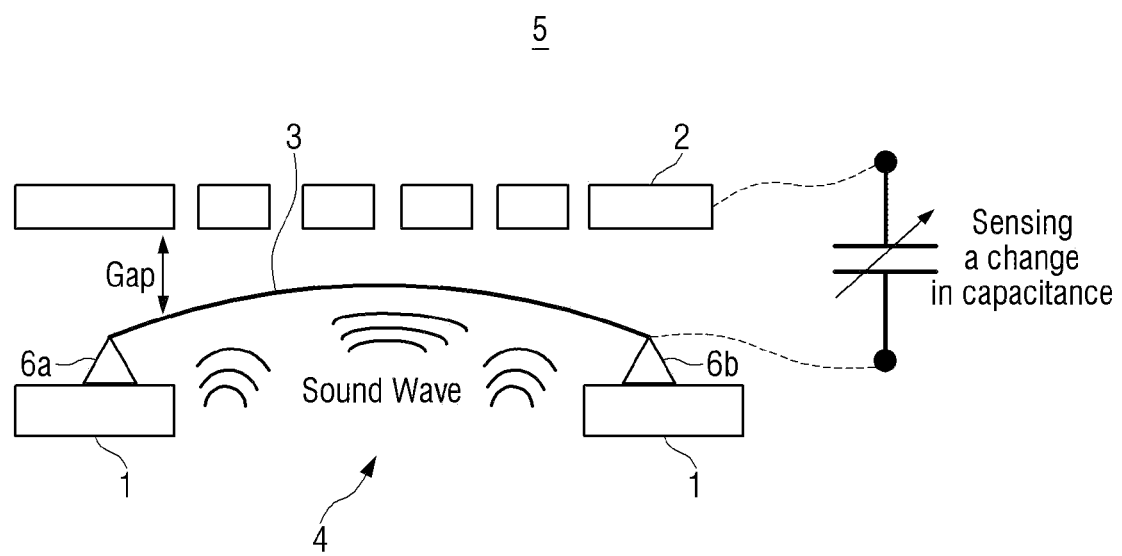
FIG. 1 is a schematic diagram showing the operation of a conventional MEMS acoustic sensor.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

Throughout the specification, like reference numerals in the drawings denote like elements.

In some embodiments, well-known steps, structures and techniques will not be described in detail to avoid obscuring the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the drawings, respective components may be enlarged or reduced in size for convenience of explanation.

Hereinafter, a MEMS acoustic sensor according to embodiments of the present invention will be described with reference to the drawings.

Figure 2:
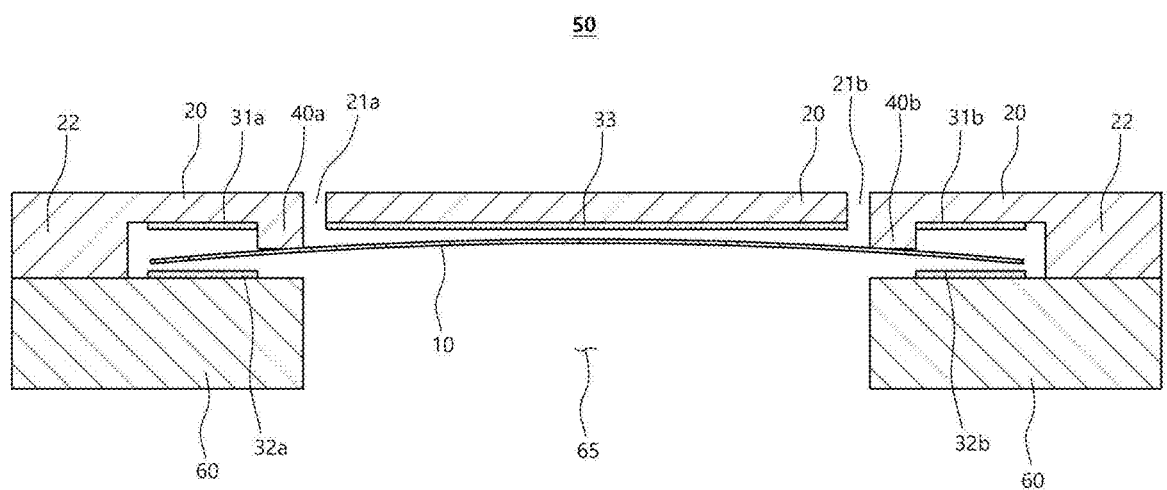
FIG. 2 is a plan view showing a MEMS acoustic sensor according to a first embodiment of the present invention.

FIG. 2 is a plan view showing a MEMS acoustic sensor 50 according to a first embodiment of the present invention. The MEMS acoustic sensor 50 may include a substrate 60 on which a cavity 65 is formed, a back plate 20 arranged on the substrate 60 and having a plurality of through-holes 21a and 21b, anchors 40a and 40b as support structures formed on the back plate 20 and protruding toward the substrate, and a diaphragm 10 supported on the anchors 40a and 40b and deformed by sound waves introduced through the cavity. Here, no part of the deformed diaphragm 10 comes into a direct contact with the substrate 60.

The diaphragm 10 may be made of, for example, a circular or rectangular polysilicon material, and may preferably have a square shape. However, it is not limited thereto, and naturally, the diaphragm 10 may be made of another material having flexibility, or may be formed of a polygon other than a circle or a square. Further, the coupling between the diaphragm 10 and the anchors 40a and 40b are made such that the diaphragm 10 is attached to the anchors 40a and 40b either directly or through an intermediate material.

In FIG. 2, the diaphragm 10 is supported by the anchors 40a and 40b formed on the back plate 20 and does not make any contact with the substrate 60. Therefore, positions of the anchors 40a and 40b may be freely arranged on the back plate 20 regardless of a position and a size of the cavity 65 so that the effective movable area of the diaphragm 10 may be larger than that of the cavity 65. Further, by using the anchors 40a and 40b, the effective movable area of the diaphragm 10 may extend to the outside of at least one anchor. Also, not only at the inside of the anchors 40a and 40b (a space between the anchors) but also to the outside of the anchors 40a and 40b may the diaphragm 10 be located. The extended diaphragm 10 thus may have a larger capacitance between the diaphragm and the back plate and may lead to an increase in the sensitivity of the MEMS acoustic sensor.

The diaphragm 10 is electrically connected to an electrode formed on the back plate 20, not to the substrate 60. Thus, not only a mechanical anchoring of the diaphragm 10 but also the electrical connection is made to the back plate 20, not to the substrate 60, so that the position of the anchor may be freely arranged on the back plate irrespective of the position and size of the cavity.

A sidewall 22 extending from the back plate 20 is supported on the substrate 60, and the cavity 65 is formed in the center of the substrate 60. Therefore, the sound waves introduced from the outside exert an external pressure on the diaphragm 10, so that the diaphragm 10 may be deformed. When a deformation occurs in a direction perpendicular to the surface of the diaphragm 10, a change in distance between the diaphragm 10 and the back plate 20 causes a change in capacitance.

In an embodiment of the present invention, the capacitance may be measured between the diaphragm 10 and the back plate 20, but it is not limited thereto and it may be measured between the diaphragm 10 and the substrate 60. In addition, it may be measured both between the diaphragm 10 and the back plate 20 and between the diaphragm 10 and the substrate 60 for more accurate detection of the coupling capacitance. Therefore, in FIG. 2, a plurality of electrodes 31a, 31b, and 33 (top electrodes) may be arranged on the back plate 20, and a plurality of electrodes 32a and 32b (bottom electrodes) may be arranged on the substrate 60.

Figure 3A:
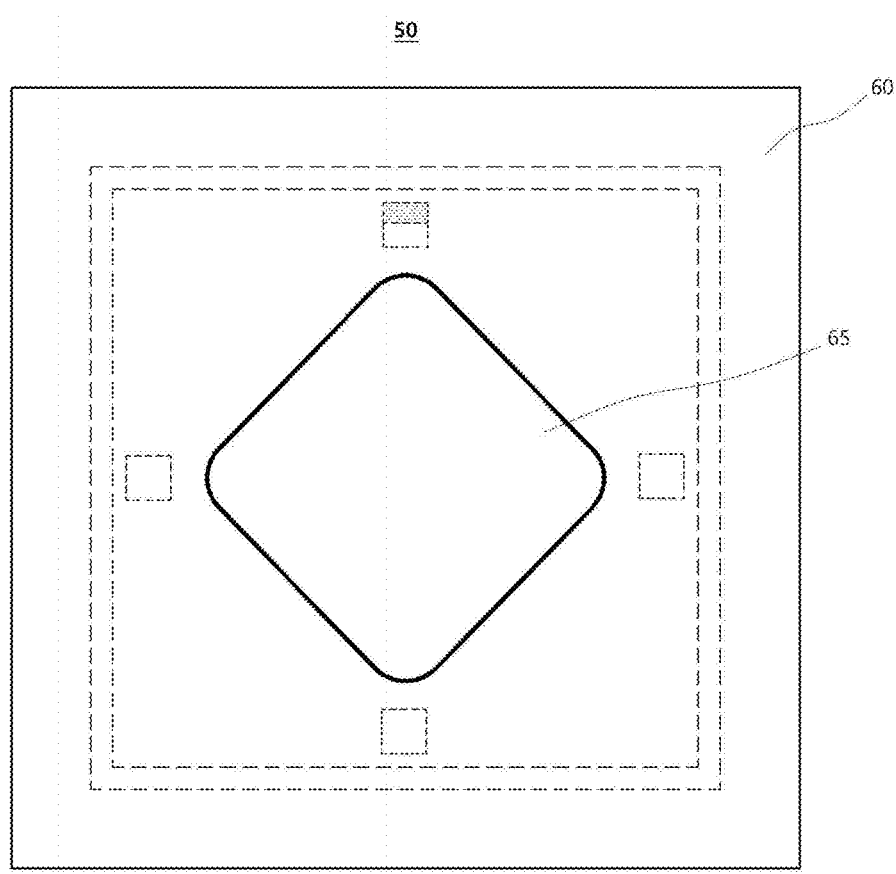
FIGS. 3A, 3B and 3C are bottom views of the MEMS acoustic sensor of FIG. 2 viewed from below.
Figure 3B:
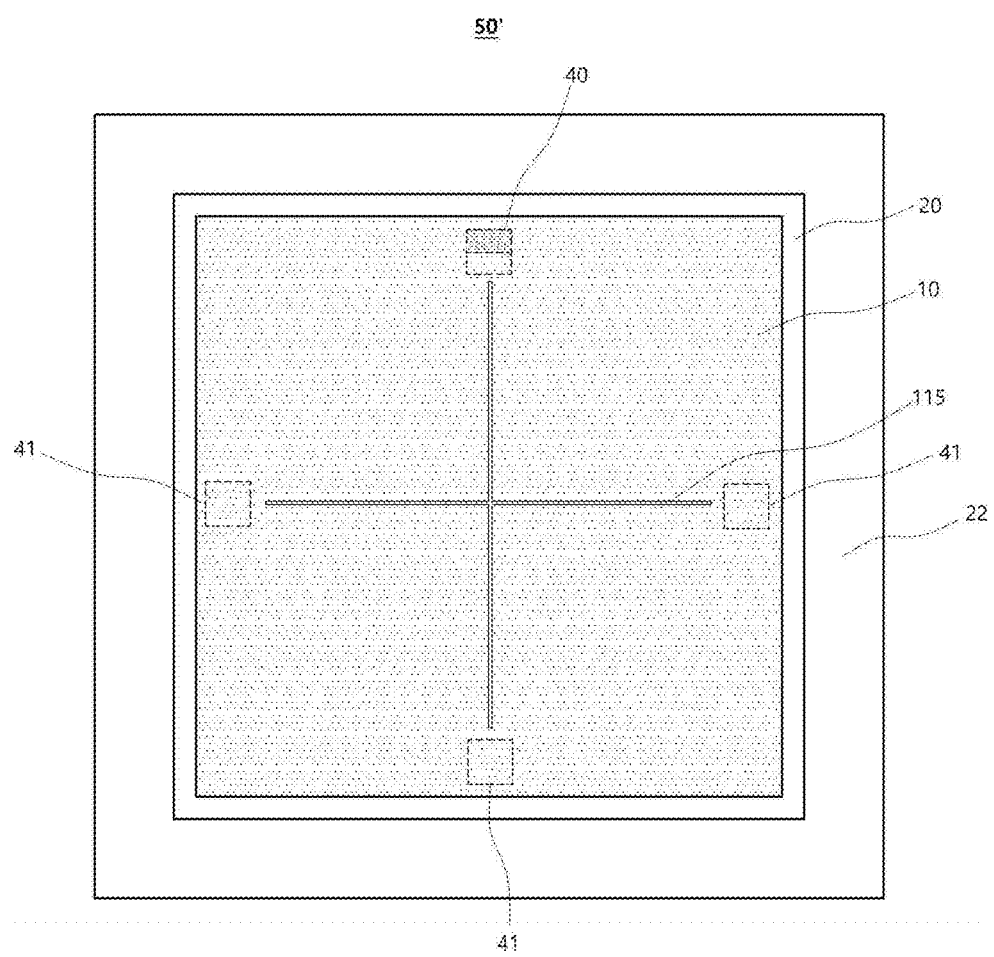
Figure 3C:
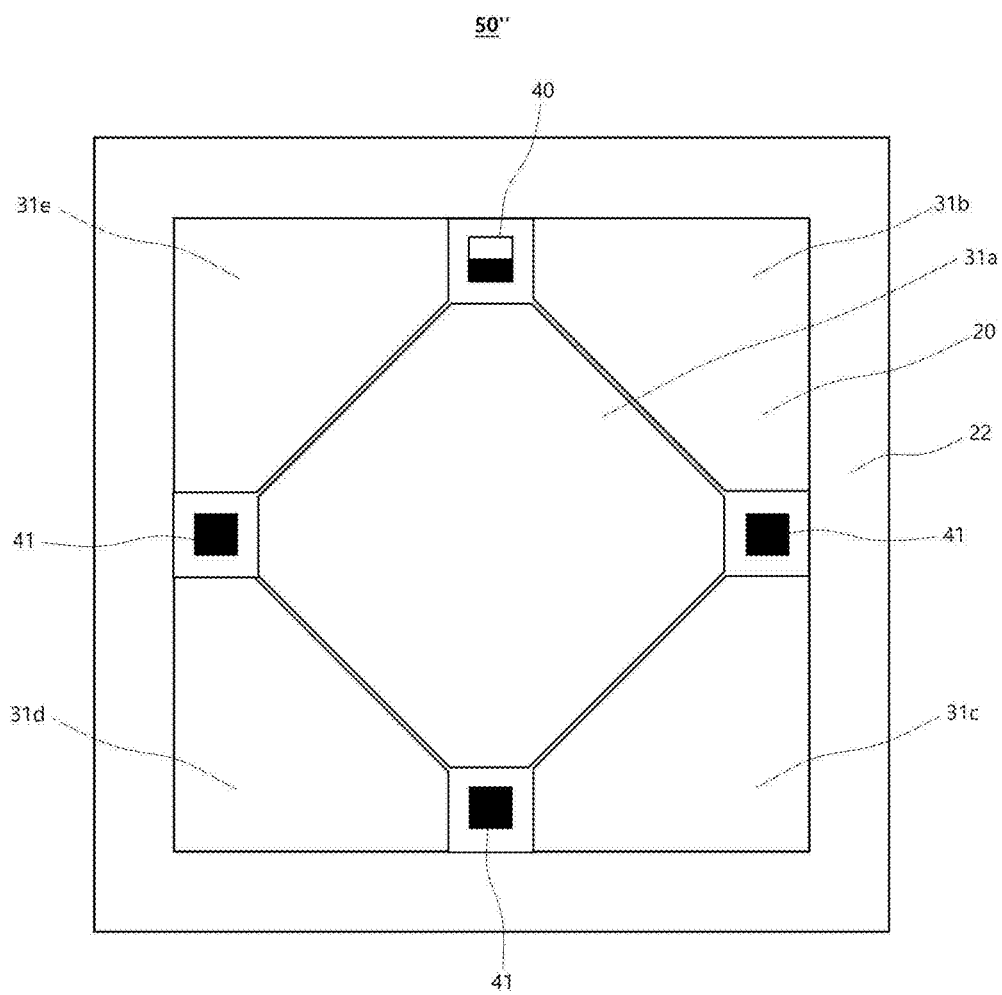

FIGS. 3A to 3C are bottom views of the MEMS acoustic sensor 50 of FIG. 2 viewed from below (from a lower surface of the substrate 60). Referring to FIG. 3A, the cavity 65 is formed at the center of the substrate 60.

FIG. 3B is a view showing the MEMS acoustic sensor 50 of FIG. 3A in which the substrate 60 removed. An outer wall 22 contacting with the substrate 60 is formed on an outer side of the back plate 20, and the diaphragm 10 having an incision line 115 is supported by anchors 40 and 41 in a space inside the back plate 20. These anchors 40 and 41 may be composed of a anchor 40 electrically connected to the diaphragm 10 and a anchor 41 simply fixing the diaphragm 10.

FIG. 3C is a view in which the diaphragm 10 is removed from the MEMS acoustic sensor 50' of FIG. 2B. A plurality of anchors 40 and 41 extending from the back plate 20 to the substrate 60 are formed in the back plate 20. Also, a plurality of top electrodes 31a, 31b, 31c, 31d, and 31d may be formed on a surface of the back plate 20. The anchors 40 and 41 and the top electrodes 31a, 31b, 31c, and 31d shown in FIG. 3C are only one embodiment. The number, size, shape, and position thereof may be varied according to the design goals.

Figure 4:
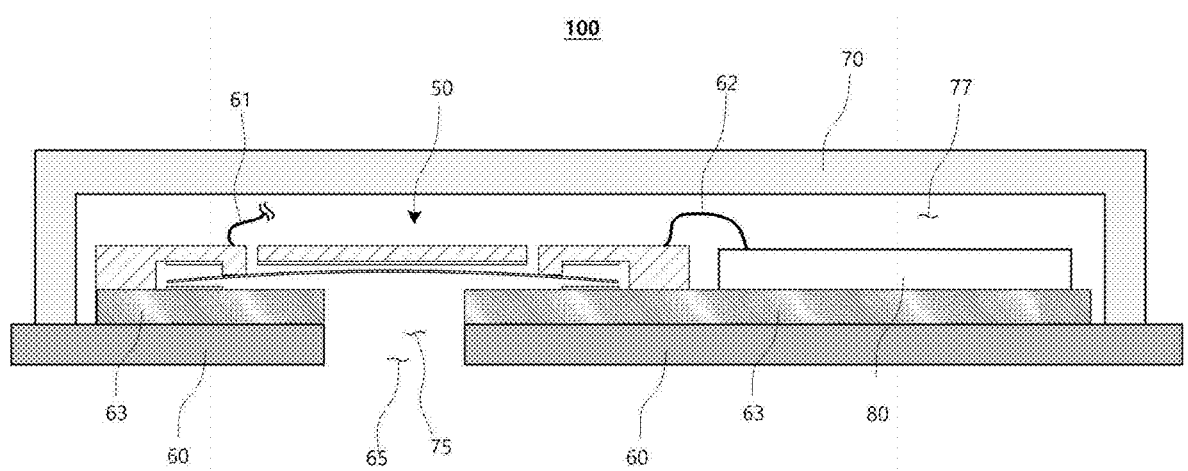
FIG. 4 is a view showing an example in which the MEMS acoustic sensor of FIG. 2 is packaged and implemented as a sensor chip.

FIG. 4 is a view showing an example in which the MEMS acoustic sensor 50 of FIG. 2 is packaged and implemented as a sensor chip 100. The sensor chip 100 is divided into two sections. One is a sound inlet formed on the substrate 63 and the support plate 60, that is, a space between the cavity 65 and the diaphragm 10 is referred to as a front chamber 75. The other side of the diaphragm 10 is referred to as a back chamber 77. In a bottom port type sensor chip 100, the MEMS acoustic sensor 50 is positioned directly above the cavity 65. An integrated circuit 80 is connected to a plurality of electrode pads via wire bonds 61 and 62, respectively, senses a variable capacitance therebetween, and converts the sensed variable capacitance into an electric signal. Such electrical signals may be, for example, digital (PDM modulation) or analog signals.

A cap member 70 is assembled together with the support plate 60 to house the MEMS acoustic sensor 50, the substrate 63, the integrated circuit 80, and the like. In terms of performance, stability, and protection against direct impact, such components are preferably housed within a MEMS acoustic sensor chip (package). Alternatively, instead of providing the cavity 65 on the substrate 63 and the support plate 60, a sensor chip may be a top port type sensor chip having a cavity in the cap member 70. In this case, positions of the front chamber and the back chamber will be opposite to each other in comparison with the sensor chip 100 of the bottom port type.

As described above, in the MEMS acoustic sensor 50, the back plate 20 is arranged on the support plate 60, and the back plate 20 is provided with anchors 40a and 40b protruding and extending downward toward the support plate 60, thereby supporting the flexible diaphragm 10 on the anchors 40a and 40b. Even in such a MEMS acoustic sensor 50, the structure and the shape of the diaphragm 10 are variously modified, thereby achieving a result more consistent with the design purpose. FIGS. 5A to 10 illustrate embodiments of a MEMS acoustic sensor having diaphragms of various structures.

Figure 5A:
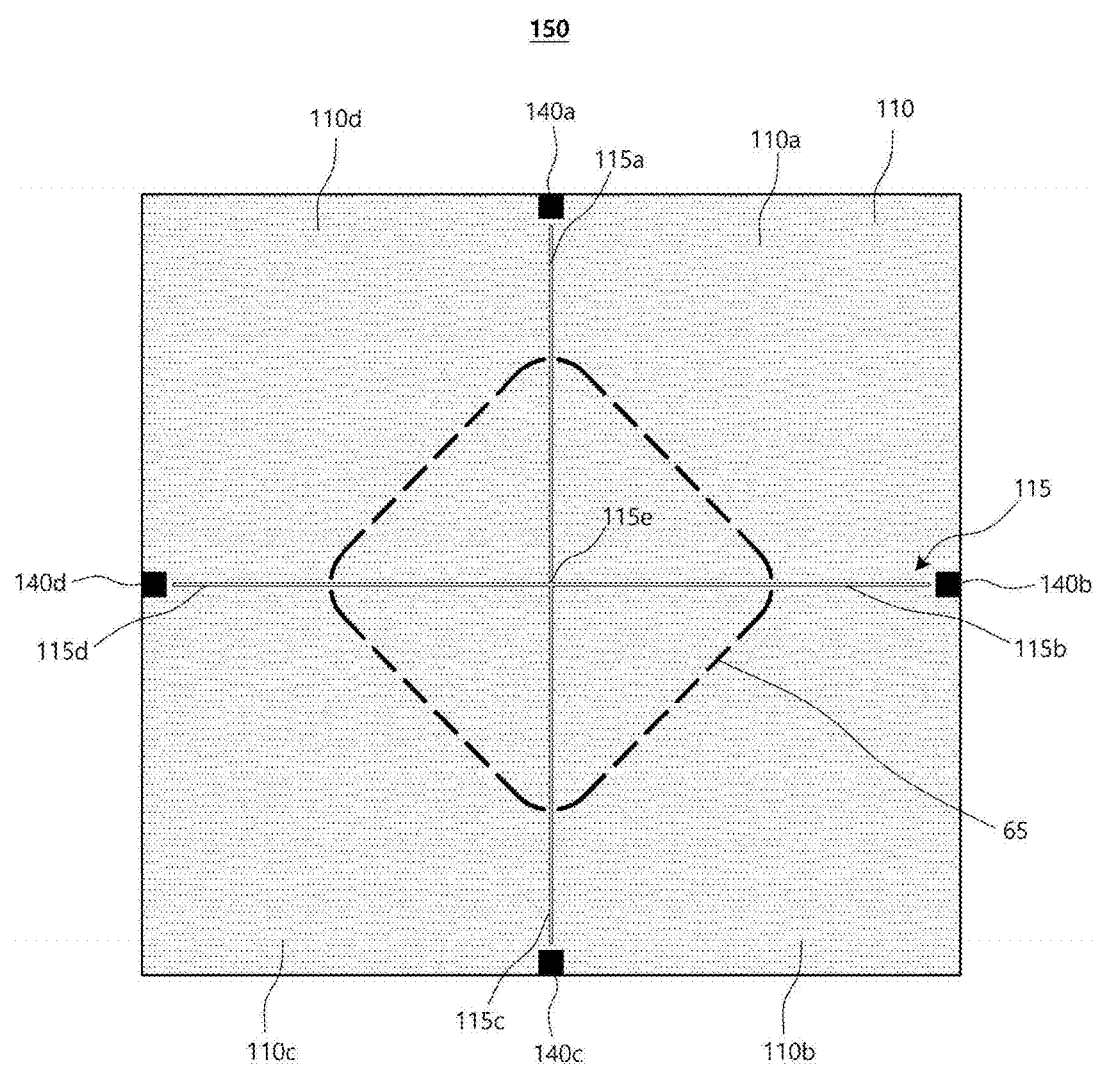
FIG. 5A is a plan view showing a MEMS acoustic sensor according to a second embodiment of the present invention.

FIG. 5A is a plan view showing a MEMS acoustic sensor 150 according to a second embodiment of the present invention. The MEMS acoustic sensor 150 includes four anchors 140a, 140b, 140c, and 140d protruding from the back plate (not shown) in a direction to the substrate (not shown). Here, the cavity 65 formed in the substrate may have various shapes and sizes. However, considering the vibration mode of the rectangular diaphragm 110, it is preferable that it has a rhombic shape staggered with the rectangular diaphragm 110.

A cross-shaped incision line 115 is formed at the center of the diaphragm 110. The diaphragm 110 is supported by four anchors 140a, 140b, 140c, and 140d in an area between an end of the cross-shaped incision line 115 and an edge of the diaphragm 110 orthogonal thereto.

Also, the diaphragm 110 may be divided into four sub-areas 110a, 110b, 110c, and 110d based on the incision line 115. Specifically, the incision line 115 includes linear incision lines 115a, 115b, 115c, and 115d, each of which separates two adjacent sub-areas. In the center of the incision line 115e where the linear incision lines 115a, 115b, 115c, and 115d meet, the four sub-areas 110a, 110b, 110c, and 110d are all separated.

Only at the vicinity of the center of the edge of the diaphragm 110 are the four sub-areas connected. The diaphragm is supported by the anchors 140a, 140b, 140c, and 140d. The diaphragm 110 is not connected to any part of the substrate and is connected to the back plate by anchors 140a, 140b, 140c, and 140d. Therefore, various portions such as the center or the edge of the diaphragm 110 may freely move.

Considering the structures of the anchors 140a, 140b, 140c, and 140d and the diaphragm 110 shown in FIG. 5A, the diaphragm 110 may be expected to have seesaw movement.

Figure 5B:
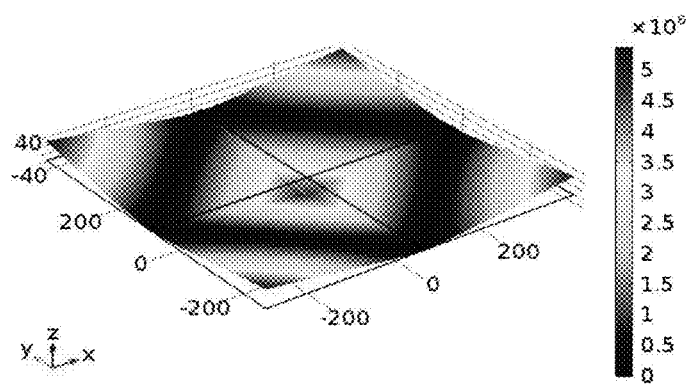
FIG. 5B is a simulation result showing a required vibration mode of a diaphragm according to the second embodiment of the present invention.

FIG. 5B is a simulation result showing a required vibration mode of the diaphragm 110 according to the second embodiment of the present invention. The required vibration mode is a mode in which the four sub-areas 110a, 110b, 110c, and 110d have a synchronized seesaw movement. In FIG. 5B, the diaphragm 110 has a size of 700×700 μm, a width of incision line of 1 μm, and an anchor size of 10×10 μm.

Figure 6A:
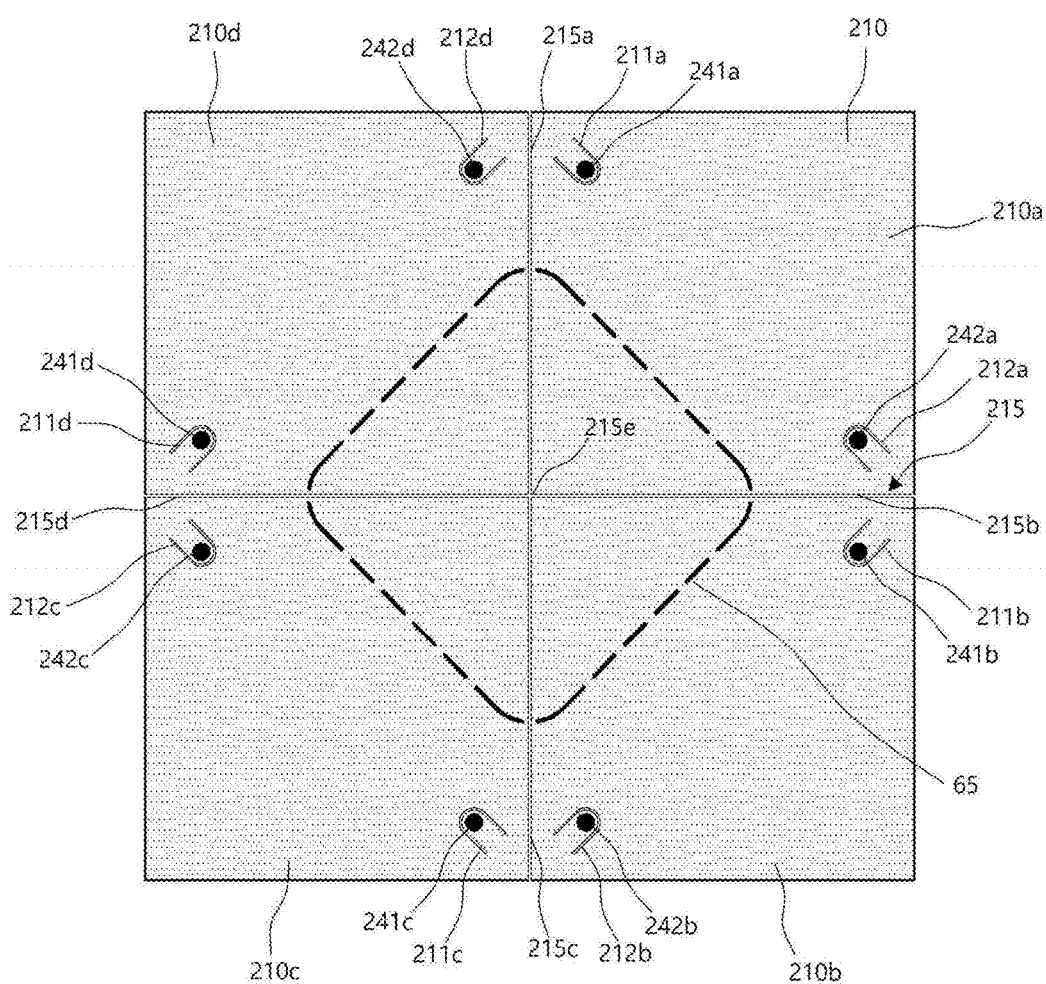
FIG. 6A is a plan view showing a MEMS acoustic sensor according to a third embodiment of the present invention.

FIG. 6A is a plan view showing a MEMS acoustic sensor 250 according to a third embodiment of the present invention.

The MEMS acoustic sensor 250 includes eight anchors 241a to 241d and 242a to 242d protruding from a rectangular diaphragm 210 and the back plate (not shown) in a direction of the substrate (not shown). Here, the cavity 65 formed in the substrate may have a rhombic shape staggered with the rectangular diaphragm 210 considering the vibration mode of the rectangular diaphragm 210.

Unlike the diaphragm 110 according to the second embodiment, the diaphragm 210 is completely separated into four sub-areas 210a, 210b, 210c, and 210d. Thus, the incision line 215 includes linear incision lines 215a, 215b, 215c, and 215d, each of which delimits two adjacent sub-areas. The diaphragm 210 is completely separated into four sub-areas 210a, 210b, 210c, and 210d by the four linear incision lines 215a, 215b, 215c, and 215d that meet at a center 215e.

Each sub-area 210a, 210b, 210c, and 210d is independently supported by a respective pair of anchors 241a and 242a, 241b and 242b, 241c and 242c, 241d and 242d. In particular, the pair of anchors may be arranged in a diagonal direction that does not include the center 215e of the diaphragm 210 out of two diagonal lines in the sub-areas.

Further, in order to increase the displacement of the diaphragm 210, a pair of additional incision lines 211a and 212a, 211b and 212b, 211c and 212c, 211d and 212d, which surround each anchor with a "U-shape," are formed in the sub-areas 210a, 210b, 210c, and 210d. Such a pair of additional incision lines are arranged to provide a spring structure when the diaphragm 210 vibrates and to face each other along an imaginary line connecting the associated pair of anchors.

The diaphragm 210 is not connected to any part of the substrate and is connected to the back plate by such a pair of anchors. Therefore, various portions such as the center or the edge of the diaphragm 210 may freely move. In addition, since the four sub-areas 210a, 210b, 210c, and 210d constituting the diaphragm 210 are completely separated from each other, they have independent vibration modes.

Figure 6B:
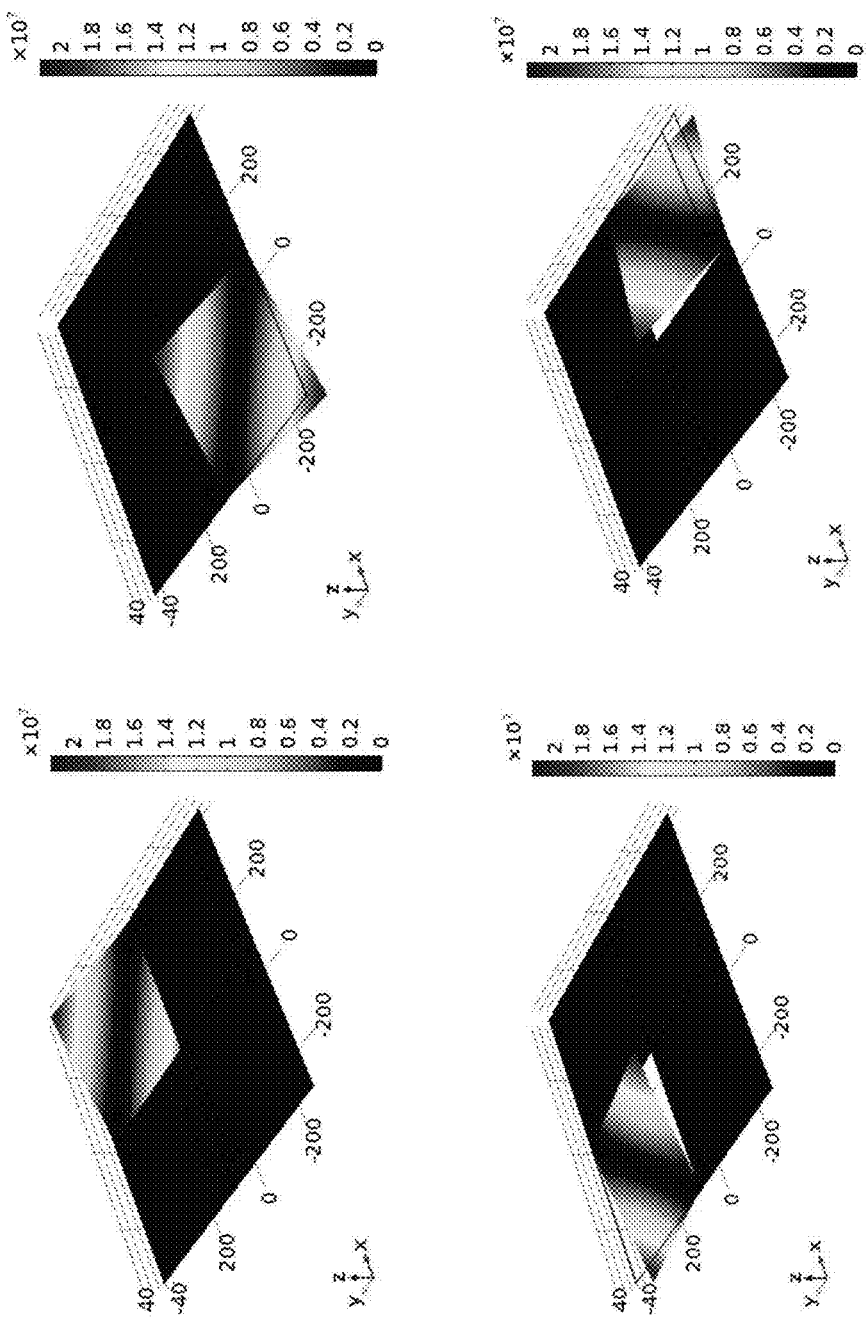
FIG. 6B is simulation results showing a required vibration mode of a diaphragm according to the third embodiment of the present invention.

FIG. 6B is simulation results showing a required vibration mode of the diaphragm 210 according to the third embodiment of the present invention. In FIG. 6B, the diaphragm 210 has a size of 700×700 µm, all of a width of incision line of 1 µm, and a diameter of 16 µm.

Referring to FIG. 6B, the required vibration mode is a mode in which the four sub-areas 210a, 210b, 210c, and 210d are independently vibrated so as to have a seesaw movement with respect to an imaginary line connecting a pair of anchors.

Figure 7A:
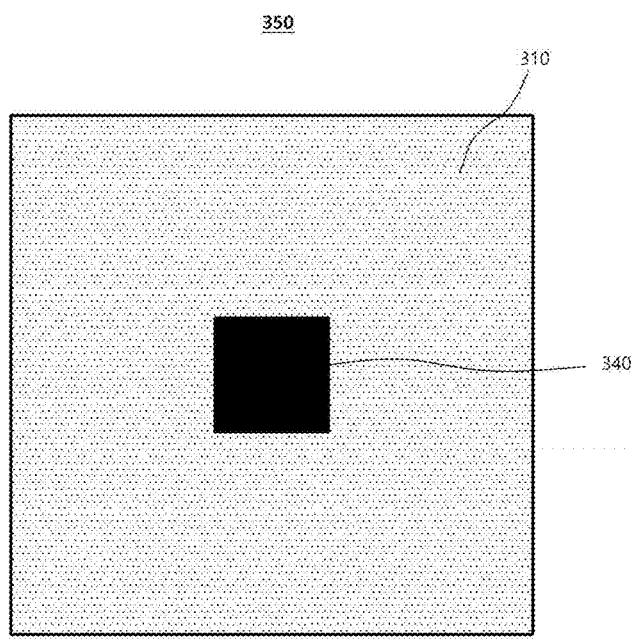
FIG. 7A is a plan view showing a MEMS acoustic sensor according to a fourth embodiment of the present invention.

FIG. 7A is a plan view showing a MEMS acoustic sensor 350 according to a fourth embodiment of the present invention.

In the fourth embodiment, a rectangular diaphragm 310 is not provided with a separate incision line but is supported by a single rectangular anchor 340 at the center. Here, the cavity (not shown) formed in the substrate may have a rectangular shape having an area similar to that of the diaphragm 310 and arranged in a stacked manner, not the rhombic shape as described above.

The diaphragm 310 is not connected to any part of the substrate and is connected to the back plate by this single anchor 340. Therefore, the diaphragm 310 may move freely, except for the central portion coupled with the anchor 340.

Figure 7B:
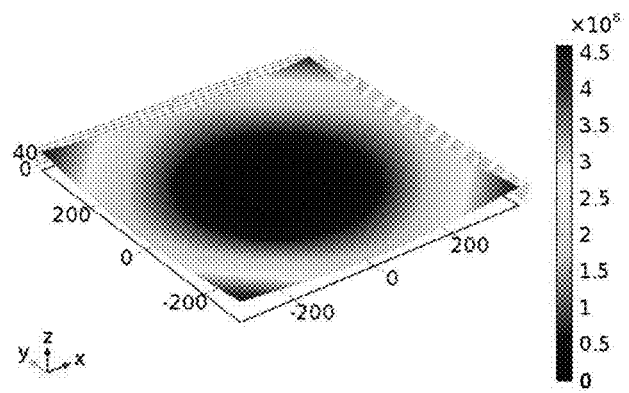
FIG. 7B is a simulation result showing a required vibration mode of a diaphragm according to the fourth embodiment of the present invention.

FIG. 7B is a simulation result showing a required vibration mode of the diaphragm 310 according to the fourth embodiment of the present invention. In FIG. 7B, the size of the diaphragm 310 is 700×700 µm and the size of the anchors is 170×170 µm.

Figure 8A:
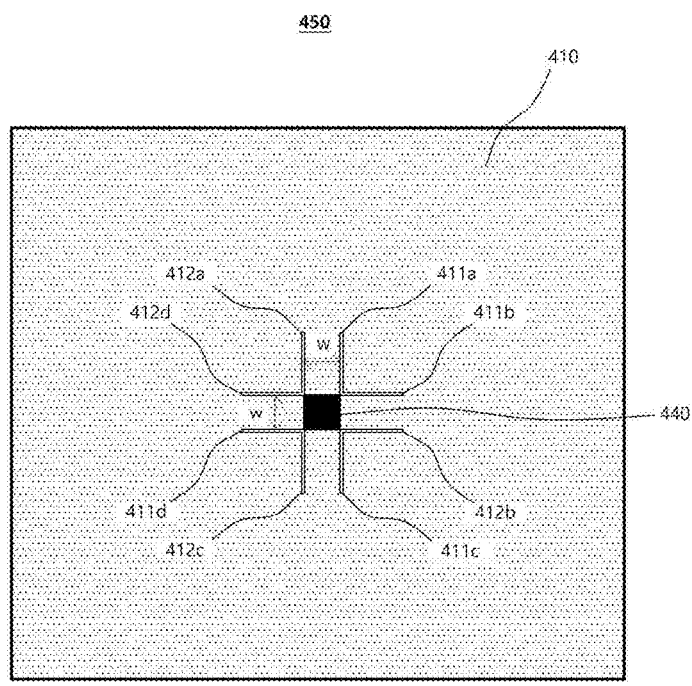
FIG. 8A is a plan view showing a MEMS acoustic sensor according to a fifth embodiment of the present invention.

FIG. 8A is a plan view showing a MEMS acoustic sensor 450 according to a fifth embodiment of the present invention.

As in the fourth embodiment, in the fifth embodiment, a diaphragm 410 is also supported by a single rectangular anchor 440 at its center. However, the diaphragm 410 has a plurality of incision lines 411a and 412a, 411b and 412b, 411c and 412c, 411d and 412d extending from a corner of the central anchor 440 toward an edge of the diaphragm 410.

These incision lines may extend from the corners of the rectangular anchor 440 in a direction orthogonal to the edges of the diaphragm 410, and may be composed of four of a pair of parallel incision lines (e.g., 411a and 412a) having a predetermined spacing w. These incisions line function as a spring structure when the diaphragm 410 vibrates.

The diaphragm 410 is not connected to any part of the substrate and is connected to the back plate by this single anchor 440. Therefore, the diaphragm 410 may move freely, except for the central portion coupled with the anchor 440.

Figure 8B:
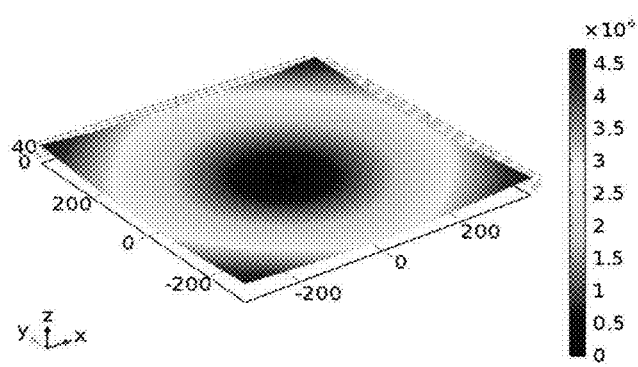
FIG. 8B is a simulation result showing a required vibration mode of a diaphragm according to the fifth embodiment of the present invention.

FIG. 8B is a simulation result showing a required vibration mode of the diaphragm 410 according to the fifth embodiment of the present invention. In FIG. 8B, the size of the diaphragm 410 is 700×700 µm. Further, in FIG. 8B, the size of the anchor is 30×30 µm. In FIG. 8B, the spacing w between the parallel incision lines is 14 µm.

Figure 9:
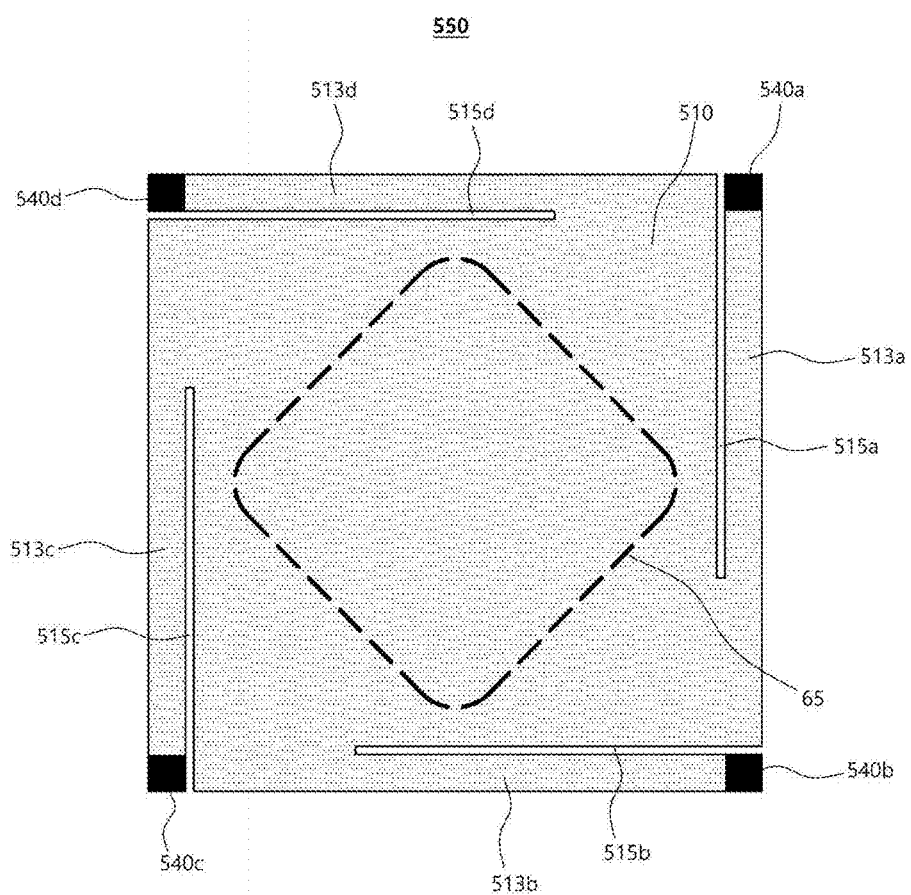
FIG. 9 is a plan view showing a MEMS acoustic sensor according to a sixth embodiment of the present invention.

FIG. 9 is a plan view showing a MEMS acoustic sensor 550 according to a sixth embodiment of the present invention.

The MEMS acoustic sensor 550 includes four rectangular anchors 540a, 540b, 540c, and 540d protruding from a rectangular diaphragm 510 and the back plate (not shown) in a direction of the substrate (not shown). Here, the cavity 65 formed in the substrate may have a rhombic shape staggered with the rectangular diaphragm 510 considering the vibration mode of the rectangular diaphragm 510 (see FIG. 9), or it may have a rectangular shape having an area similar to that of the diaphragm 510 and arranged in a stacked manner.

However, in order to form spring arms 513a, 513b, 513c, 513d at a portion where the diaphragm 510 is supported by the anchors 540a, 540b, 540c, and 540d, four parallel incision lines 515a, 515b, 515c, and 515d are formed while being spaced apart from the edges of the diaphragm 510 at regular intervals. These four incisions may be arranged spirally with respect to each other with reference to the center of the diaphragm 510.

The diaphragm 510 is not connected to any part of the substrate and is connected to the back plate by such a pair of anchors. Therefore, various portions such as the center or the edge of the diaphragm 510 may freely move. Particularly, when the diaphragm 510 is displaced in a direction perpendicular to a plane formed by the diaphragm 510 due to external sound waves, the spring arms 513a, 513b, 513c, and 513d are displaced in the vertical direction and support the diaphragm 510.

Figure 10:
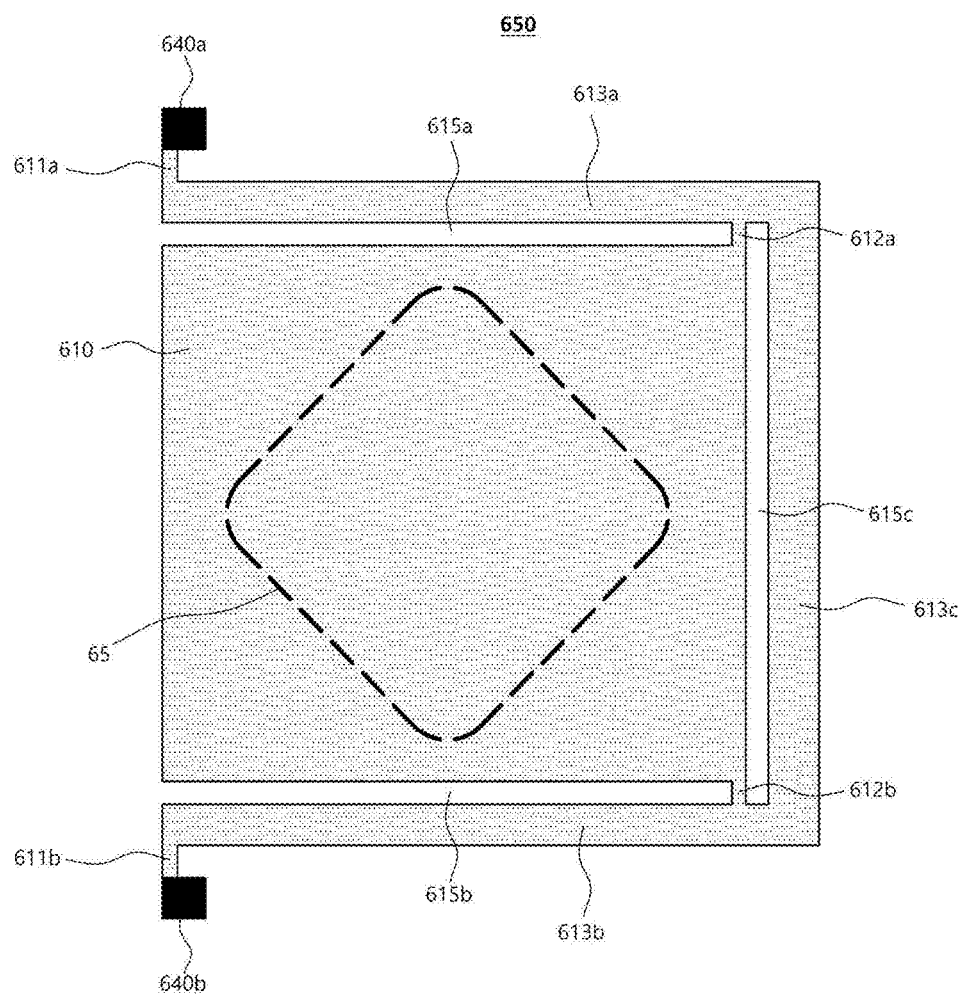
FIG. 10 is a plan view showing a MEMS acoustic sensor according to a seventh embodiment of the present invention.

FIG. 10 is a plan view showing a MEMS acoustic sensor 650 according to a seventh embodiment of the present invention.

The MEMS acoustic sensor 650 includes two rectangular anchors 640a and 640b protruding from a rectangular diaphragm 610 and the back plate (not shown) in a direction of the substrate (not shown). Here, the cavity 65 formed in the substrate may have a rhombic shape considering the vibration mode of the rectangular diaphragm 610 (see FIG. 10), or it may have a rectangular shape having an area similar to that of the diaphragm 610 and arranged in a stacked manner.

In order to form spring arms 613a and 613b at a portion where the diaphragm 610 is supported by the anchors 640a and 640b, two parallel incision lines 615a and 615b are formed while being spaced apart from the edges of the diaphragm 610 at regular intervals. These two incision lines 615a and 615b are formed at positions facing each other to provide spring arms 613a and 613b, respectively. Further, main links 611a and 611b connected to each of the anchors 640a and 640b in a direction perpendicular to the spring arms 613a and 613b are formed at ends of the spring arms 613a and 613b. Therefore, when the diaphragm 610 is displaced in a direction perpendicular to the plane formed by the diaphragm 610, the main links 611a and 611b function as a torsion spring.

In addition, the diaphragm 610 may be provided with an additional incision line 615c on an opposite edge of the main link 611a and 611b in a direction parallel to the edge. Therefore, additional links 612a and 612b are formed between the additional incline line 615c and the two incision lines 615a and 615b in a direction parallel to the main links 611a and 611b. The additional links 612a and 612b also serve as the torsion spring when the diaphragm 610 is displaced.

As a whole, when the diaphragm 610 is displaced by the sound wave, primary torsion (twist) occurs by the main links 611a and 611b, and secondary torsion (twist) occurs by the additional links 612a and 612b. These primary and secondary torsions are rotational movements in opposite directions to each other. Due to these two-stage torsions, the diaphragm 610 may have a very large displacement, which may lead to an increase in coupling capacitance and an increase in sensitivity.

As described above, the embodiments of the present invention provide minimal support for the diaphragm to allow maximum free movement of the diaphragm, thereby exhibiting robustness to thermal stress or thermal deformation as well as the rise in coupling capacitance. Particularly, in the case of the diaphragm according to the embodiments as described above, when the diaphragm has the incision line, the two areas divided by the incision line may be independently expanded and contracted. Therefore, the release effect of such thermal stress or thermal deformation may be more clearly provided.

Figure 11A:
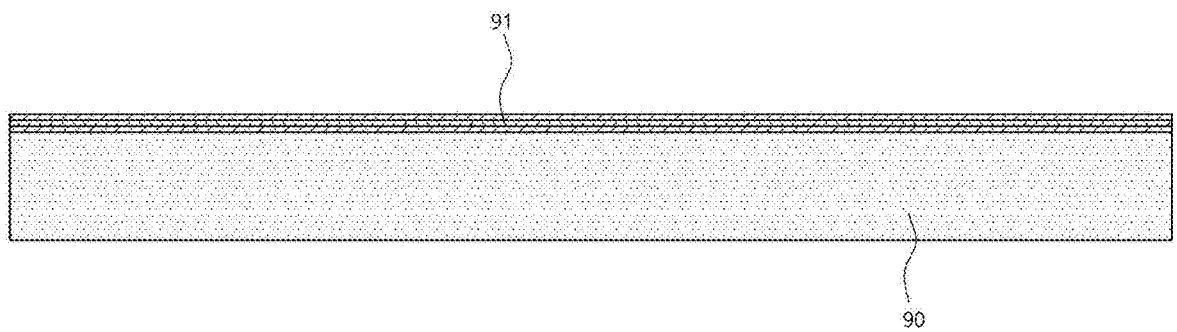
FIGS. 11A, 11B, 11C, 11D, 11E, 11F, 11G, 11H, 11I, 11J, 11K, 11L, 11M and 11N are views for explaining a manufacturing process of a MEMS acoustic sensor according to an embodiment of the present invention.
Figure 11B:
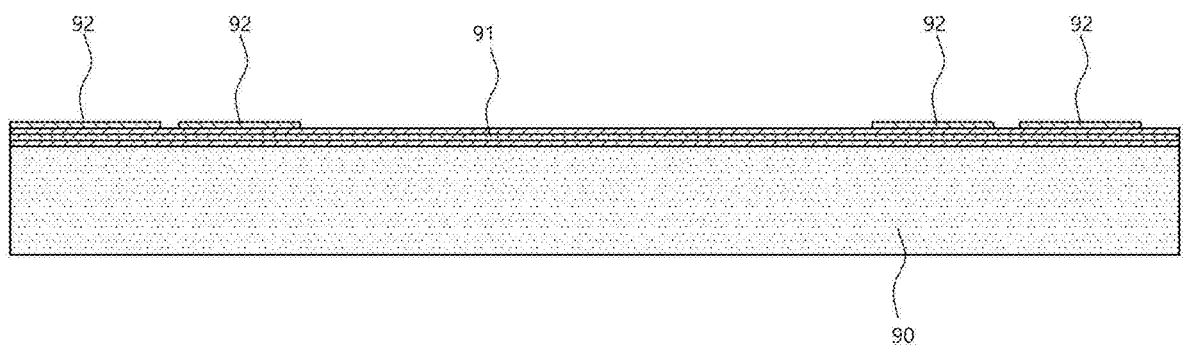
Figure 11C:
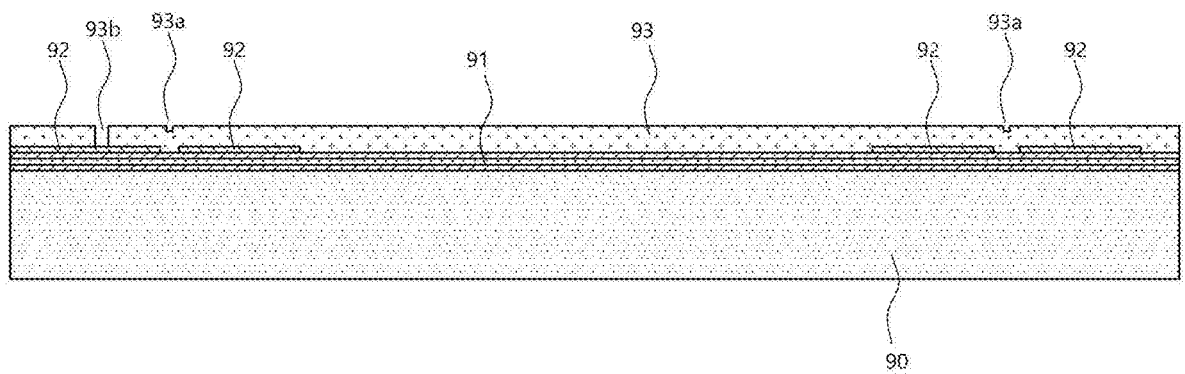
Figure 11D:
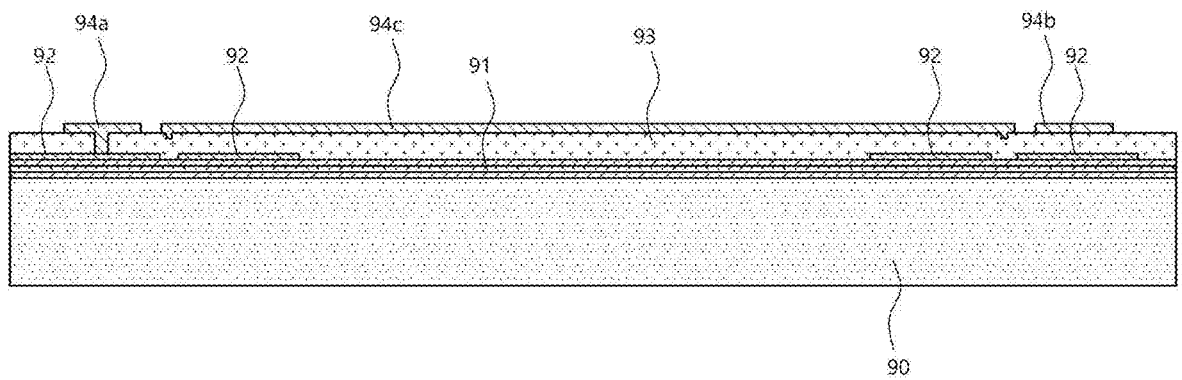
Figure 11E:
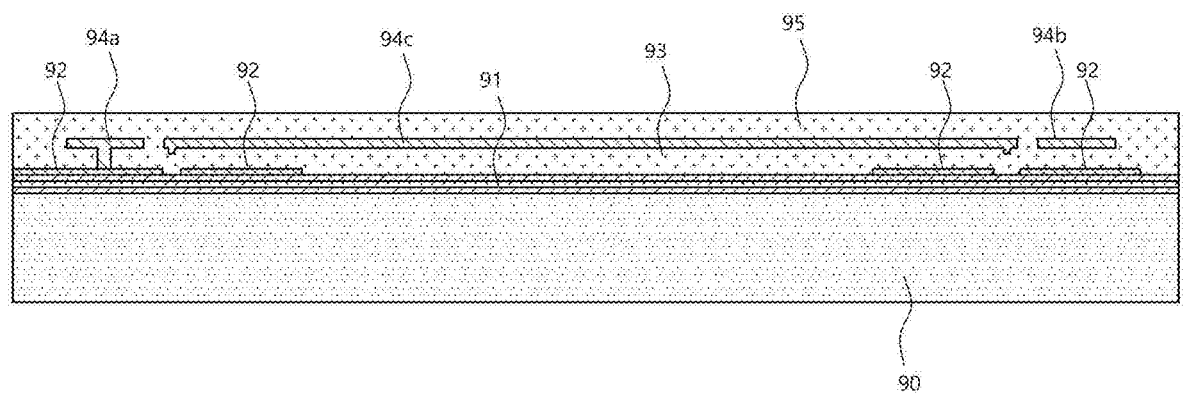
Figure 11F:
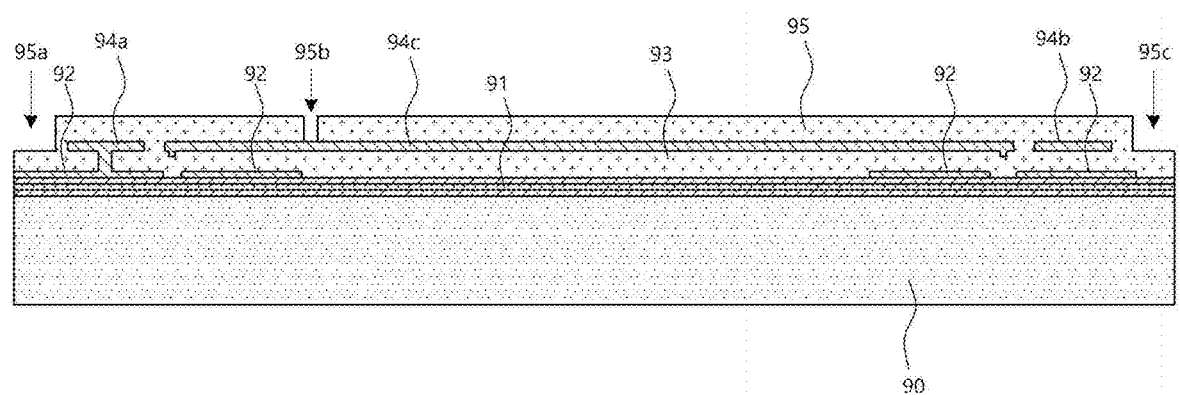
Figure 11G:
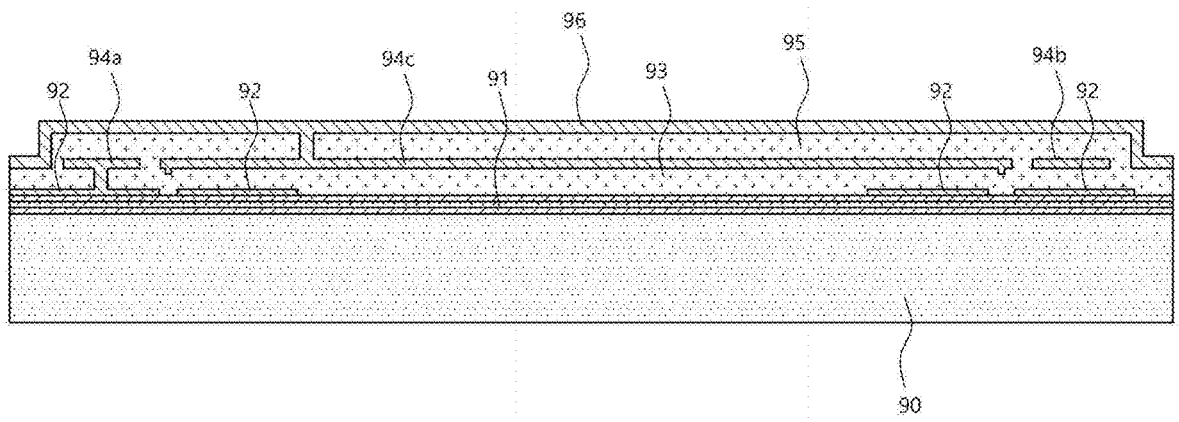
Figure 11H:
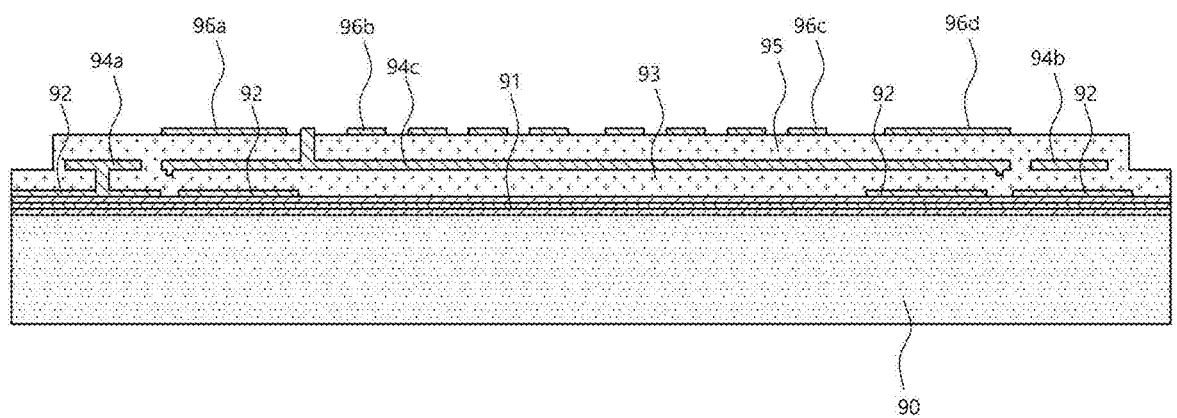
Figure 11I:
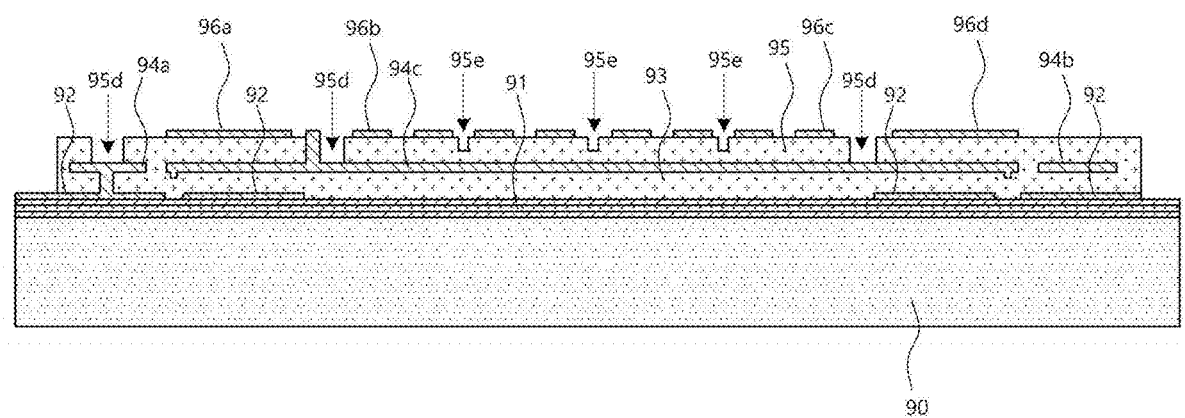
Figure 11J:
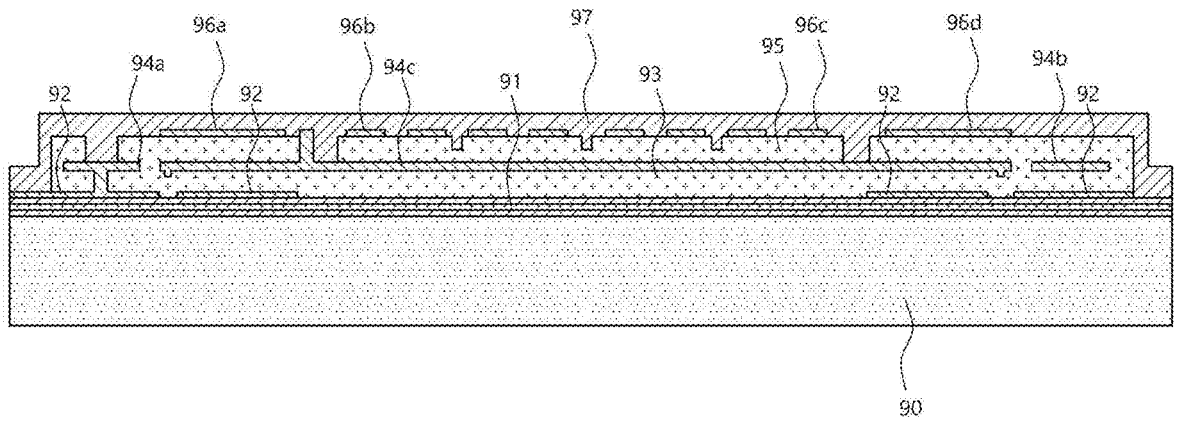
Figure 11K:
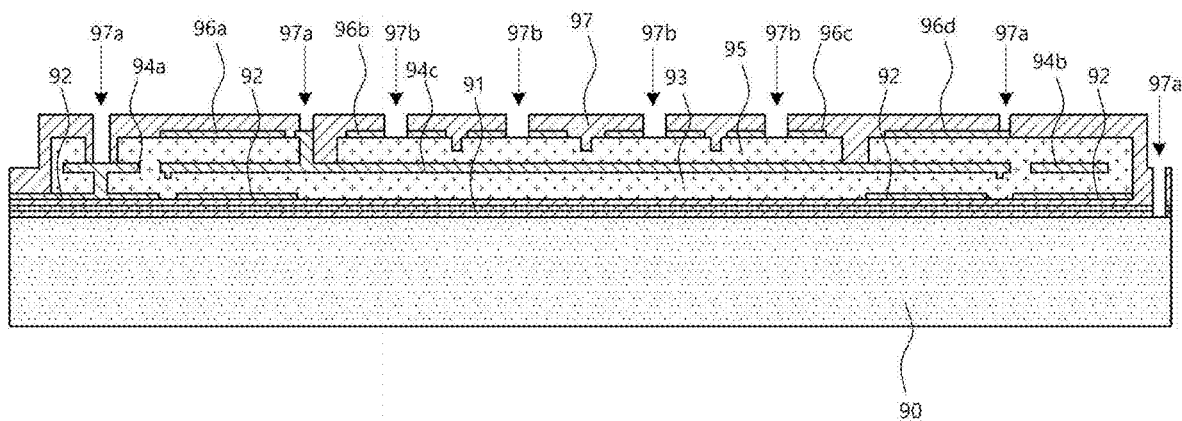
Figure 11L:
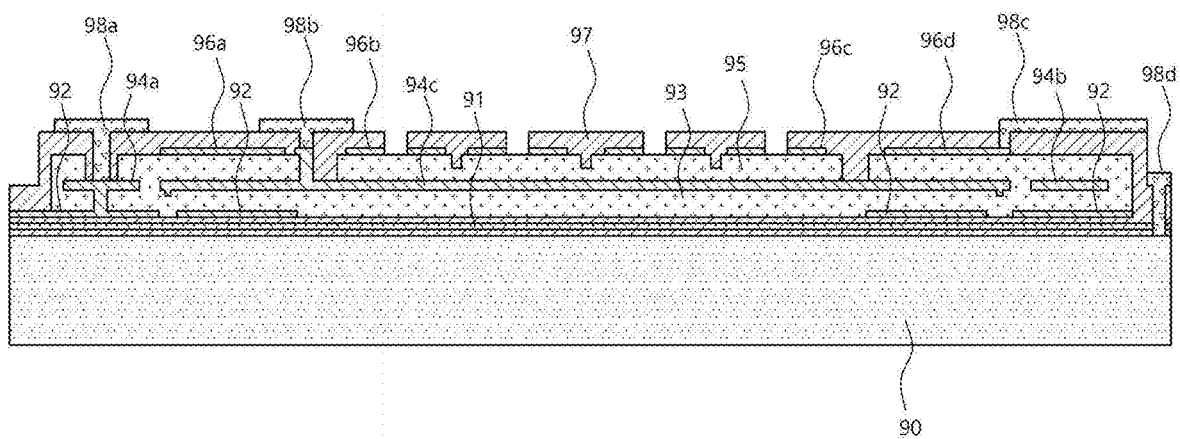
Figure 11M:
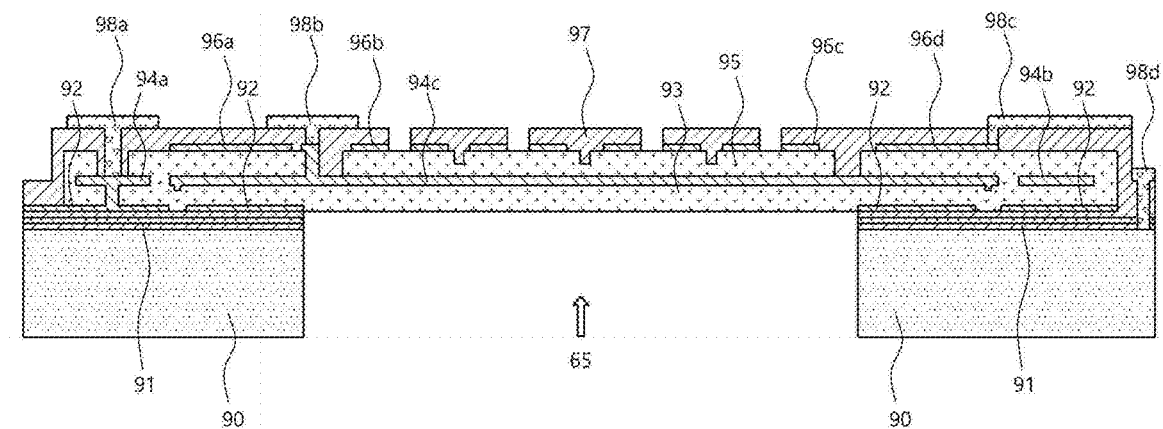
Figure 11N:
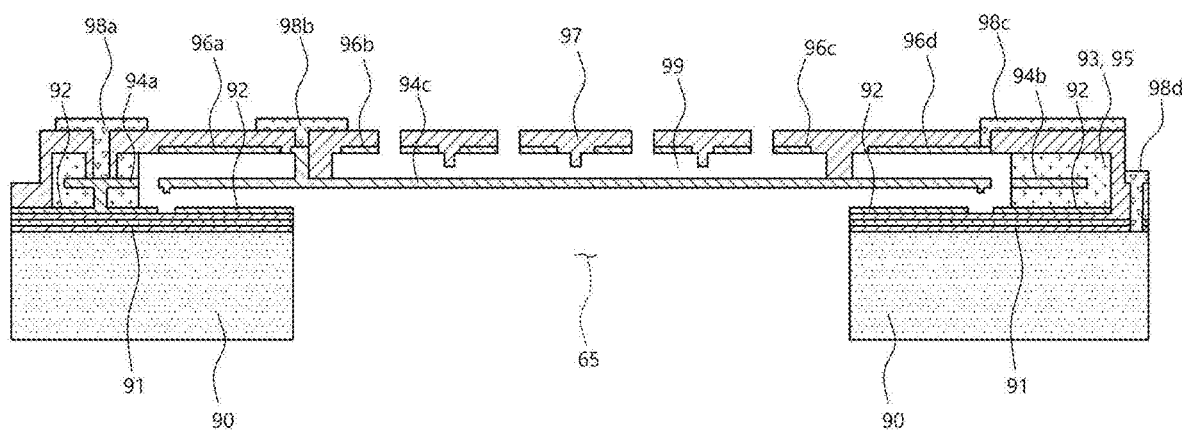

FIGS. 11A to 11N are views for explaining a manufacturing process of a MEMS acoustic sensor according to an embodiment of the present invention.

Referring first to FIG. 11A, an insulating layer 91 is first deposited on a wafer substrate 90. The wafer substrate 90 is made, for example, by an N-type 6 inch wafer. The insulating layer 91 may be deposited and formed, for example, in the order of nitride, oxide, and nitride. This insulating layer 91 may be deposited using a chemical vapor deposition process (CVD).

Next, a polysilicon layer (about 1 1 µm) for forming a bottom electrode is deposited on the insulating layer 91, and electrodes 92 are patterned by etching (see FIG. 11B). For example, reactive ion etching (ME) may be used as such a patterning technique.

Then, a sacrifice layer 93 is deposited on the electrodes 92 and the insulating layer 91 (see FIG. 11C). This sacrificial layer 93 uses a material having good etching selectivity in consideration of being removed by etching in the last step. A silicon oxide film may be used as the sacrifice layer 93. After the sacrifice layer 93 is deposited in this manner, a non-through notch 93a is formed by partial etching, and a through notch 93b is formed by complete etching (see FIG. 11C).

Next, polysilicon layers 94a, 94b, and 94c for forming diaphragms are deposited on the sacrificial layer 93 and then patterned by etching (see FIG. 11D). Such a polysilicon layer may be deposited to a thickness of about 1 to 2 µm depending on a thickness of the desired diaphragm. The non-through notch 93a and the through notch 93b are also filled with the polysilicon layer by deposition. Particularly, in the through notch 93b, the polysilicon layer is electrically connected to the electrode 92 also.

Then, a second sacrificial layer 95 is again deposited (see FIG. 11E). The second sacrificial layer 95 may be made of the same material as the first sacrificial layer 93. The second sacrificial layer 95 is etched to form necessary notches 95a, 95b, and 95c before depositing the polysilicon layer to create a top electrode (see FIG. 11F).

After the notches 95a, 95b, and 95c are formed in the second sacrificial layer 95, a polysilicon layer 96 for the top electrode is stacked on the second sacrificial layer 95 (see FIG. 11G). Thereafter, the polysilicon layer 96 is etched to form top electrodes 96a, 96b, 96c, and 96d (see FIG. 11H). After that, the through notches 95d and the non-through notches 95e are formed again in the second sacrificial layer 95 (see FIG. 11I).

Next, an insulating material (e.g., nitride) is deposited on the second sacrificial layer 95 and the top electrodes 96a, 96b, 96c, and 96d to form a back plate layer 97 (see FIG. 11J). Thereafter, the back plate layer 97 is etched to form through notches 97a for electrode connection and through-holes 97b for air passages of the back plate (see FIG. 11K).

Next, a plurality of electrode pads 98a, 98b, 98c, and 98d are formed in the through notches 97a. Among these, the electrode pad 98a is electrically connected to the bottom electrode 92, and the electrode pad 98b is electrically connected to the diaphragm layer 94c, and the electrode pad 98c is electrically connected to the top electrode 96d. Further, the electrode pad 98d is formed to be electrically connected to the substrate 91 itself. Since the diaphragm layer 94c is electrically connected through the electrode pad 98b, it may not form a direct electrical connection between the substrate and the diaphragm layer 94c.

Thereafter, a central portion of the substrate 90 and the insulating layer 91 is etched from below to form the cavity 65 (see FIG. 11M). Finally, the first sacrificial layer 93 and the second sacrificial layer 95 are removed by, for example, vapor HF (vapor hydrofluoric acid) etching (see FIG. 11N). An air gap 99 is formed between the diaphragm layer 94c and the back plate layer 97 by etching of the first and second sacrificial layers 93 and 95. However, a portion of the first and second sacrificial layers 93 and 95 still remains on the outer portion of the diaphragm 94c to form a support sidewall.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A MEMS acoustic sensor comprising:
   a substrate comprising a cavity;
   a back plate supported on the substrate and comprising a plurality of through-holes;

at least one anchor projecting from the back plate toward the substrate; and a diaphragm supported by the at least one anchor and deformed by a sound wave introducing from the outside, wherein no part of the deformed diaphragm comes into contact with the substrate, wherein a metal pad is disposed on the back plate and within the area of the diaphragm, and the metal pad electrically connects to the diaphragm through the back plate at the at least one anchor.

2. The MEMS acoustic sensor of claim 1, wherein at least one top electrode is arranged on the back plate, and/or at least one bottom electrode is arranged on the substrate, such that a coupling capacitance between the back plate and the diaphragm and/or between the substrate and the diaphragm is measured.

3. The MEMS acoustic sensor of claim 1, wherein an effective movable area of the diaphragm is larger than the cavity.

4. The MEMS acoustic sensor of claim 1, wherein the diaphragm has a rectangular shape.

5. The MEMS acoustic sensor of claim 4, wherein the cavity has a rhomboidal shape staggered with the diaphragm.

6. The MEMS acoustic sensor of claim 4, wherein the diaphragm has a cross-shaped incision line extending from a center of the diaphragm in a direction orthogonal to an edge of the diaphragm.

7. The MEMS acoustic sensor of claim 6, wherein the diaphragm is supported by the at least one anchor in an area between an end of the cross-shaped incision line and an edge of the diaphragm orthogonal thereto.

8. The MEMS acoustic sensor of claim 4, wherein the diaphragm has a cross-shaped incision line that extends from a center of the diaphragm in a direction orthogonal to an edge of the diaphragm and completely divides the diaphragm into four sub-areas.

9. The MEMS acoustic sensor of claim 8, wherein the at least one anchor comprises a pair of anchors supporting each of the four sub-areas, wherein the pair of anchors are arranged in a direction of a diagonal line that does not include the center of the diaphragm among two diagonal lines in the sub-areas.

10. The MEMS acoustic sensor of claim 9, wherein the diaphragm comprises a pair of U-shaped incision lines, each of which surrounding around a pair of diagonally arranged anchors, respectively, wherein the pair of U-shaped incision lines are arranged in a direction facing to each other.

11. The MEMS acoustic sensor of claim 4, wherein the at least one anchor is a single rectangular anchor that supports a center of the diaphragm.

12. The MEMS acoustic sensor of claim 11,
wherein the diaphragm comprises four pairs of parallel incision lines extending from a corner of the rectangular anchor in a direction orthogonal to an edge of the diaphragm.

13. The MEMS acoustic sensor of claim 4,
wherein the at least one anchor comprises four anchors,
wherein the diaphragm comprises four incision lines that are formed parallel to edges of the diaphragm at regular intervals, and the four anchors are connected to the ends of four arms formed by the four incision lines, respectively.

14. The MEMS acoustic sensor of claim 4,
wherein the at least one anchor comprises two anchors,
wherein the diaphragm comprises two incision lines formed parallel along a pair of facing edges of the diaphragm, and ends of two arms formed by the two incision lines are connected to the two anchors by two main links perpendicular to the two arms, respectively.

15. The MEMS acoustic sensor of claim 14, wherein the diaphragm further comprises an additional incision line formed in a direction orthogonal to the two incision lines, and an additional link perpendicular to the two incision lines is formed between the additional incision line and the two incision lines.

16. The MEMS acoustic sensor of claim 15, wherein when the diaphragm is deformed by the sound wave, the diaphragm is torsionally deformed in two stages by the main link and the additional link.

* * * * *